(12) United States Patent  
Butzmann

(10) Patent No.: US 8,797,040 B2  
(45) Date of Patent: Aug. 5, 2014

(54) METHOD, ELECTRIC CIRCUIT ARRANGEMENT AND ELECTRIC MEMORY UNIT FOR DETERMINING A CHARACTERISTIC STATUS PARAMETER OF THE MEMORY UNIT

(75) Inventor: Stefan Butzmann, Beilstein (DE)

(73) Assignee: Robert Bosch GmbH, Stuttgart (DE)

( * ) Notice: Subject to any disclaimer, the term of this patent is extended or adjusted under 35 U.S.C. 154(b) by 362 days.

(21) Appl. No.: 13/146,055

(22) PCT Filed: Jan. 14, 2010

(86) PCT No.: PCT/EP2010/050384  
§ 371 (c)(1),  
(2), (4) Date: Jul. 25, 2011

(87) PCT Pub. No.: WO2010/086230  
PCT Pub. Date: Aug. 5, 2010

(65) Prior Publication Data  
US 2011/0279122 A1  Nov. 17, 2011

(30) Foreign Application Priority Data  
Jan. 28, 2009  (DE) .................. 10 2009 000 451

(51) Int. Cl.  
*G01N 27/416*  (2006.01)

(52) U.S. Cl.  
USPC ............. 324/426; 324/436; 324/430; 324/34

(58) Field of Classification Search  
USPC .................. 324/430, 433, 434, 436  
See application file for complete search history.

(56) References Cited

U.S. PATENT DOCUMENTS

| | | | |
|---|---|---|---|
| 5,250,903 A | 10/1993 | Limuti et al. | |
| 5,537,042 A | 7/1996 | Beurler et al. | |
| 6,172,505 B1 * | 1/2001 | Bertness | 324/430 |
| 6,262,563 B1 * | 7/2001 | Champlin | 320/134 |
| 6,340,879 B1 * | 1/2002 | Blacker | 320/153 |
| 6,426,628 B1 * | 7/2002 | Palm et al. | 324/427 |
| 7,541,814 B2 * | 6/2009 | De Doncker et al. | 324/426 |
| 2008/0265842 A1 | 10/2008 | Hart et al. | |
| 2011/0018495 A1 * | 1/2011 | Komiyama | 320/108 |

FOREIGN PATENT DOCUMENTS

| | | |
|---|---|---|
| DE | 2745003 A1 | 4/1979 |
| DE | 10228351 A1 | 1/2004 |
| WO | 2008130711 A1 | 10/2008 |

* cited by examiner

*Primary Examiner* — Drew A Dunn  
*Assistant Examiner* — David Henze-Gongola  
(74) *Attorney, Agent, or Firm* — Maginot, Moore & Beck

(57) ABSTRACT

The invention relates to a method for determining a characteristic status parameter of a memory unit via an electric circuit arrangement. In the circuit arrangement at least one inductive component and at least one capacitive component are arranged, forming a tuned circuit with the memory unit. The method has the following steps of energizing the tend circuit by temporary charging of the capacitive component, the energizing being carried out by an energizing device electrically supplied by the memory unit, and determining a time-dependent voltage change at the capacitive component after terminating the energizing and determining the characteristic status parameter from the time-dependence of the voltage change. The invention further relates to a corresponding electrical circuit arrangement and an electrical memory, including such a circuit arrangement.

7 Claims, 2 Drawing Sheets

METHOD, ELECTRIC CIRCUIT ARRANGEMENT AND ELECTRIC MEMORY UNIT FOR DETERMINING A CHARACTERISTIC STATUS PARAMETER OF THE MEMORY UNIT

CROSS-REFERENCE TO RELATED APPLICATION

This application is a 35 USC 371 application of PCT/EP 2010/050384 filed on Jan. 14, 2010.

BACKGROUND OF THE INVENTION

1. Field of the Invention

The invention relates to a method for determining a characteristic status parameter of a memory unit by means of an electric circuit arrangement.

2. Description of the Prior Art

In such a method, as the characteristic status parameter, the aging status of the memory unit is determined by means of an electric circuit arrangement. The electric memory unit is a single electric memory cell or a plurality of memory cells electrically interconnected to one another, in particular an electric memory. This kind of electric memory is for example a rechargeable battery.

One problem with the use of batteries in stationary applications, such as in wind farms or in vehicles, such as hybrid or electric vehicles, is to determine the aging status of the individual memory cells (battery cells). The aging status is a characteristic status parameter of the memory cell and is estimated with adequate precision in a suitable way by determining the internal resistance of the individual memory units, in particular memory cells, by imposing currents of different frequency. This method is performed in validation and test environments using complicated laboratory equipment. For the purpose, the memory unit whose aging status is to be determined is stimulated with high-power current sources, and the internal resistance is determined by means of the voltage change ascertained via the individual memory units.

SUMMARY OF THE INVENTION

The method of the invention is effected by means of a circuit arrangement, in which at least one inductive component and at least one capacitive component are disposed that with the memory unit form an oscillator circuit; the method has the following steps: exciting the oscillator circuit by means of temporary subjection of the capacitive component to a charge, the exciting being effected by means of an excitation device supplied electrically by the memory unit; ascertaining a time-dependent voltage change at the capacitive component after the termination of the excitation; and determining the characteristic status parameter from the time dependency of the voltage change. In such a method, the excitation of the memory unit is effected energy-efficiently and at low expense. Moreover, the method can be employed for various frequencies. Since the excitation device is supplied electrically, that is, supplied with electrical energy, by the electric memory unit itself, an additional energy supply is dispensed with. Since the oscillator circuit is excited to oscillation by means of a temporary subjection of a capacitive component to a charge, and not by a periodic excitation, this excitation can be employed for oscillator circuits of different natural frequencies.

The electric memory unit is a unit of a electric memory that as its smallest unit includes a single electrical memory cell of an electric memory and as its largest possible unit is the electric memory itself. The electric memory is in particular a rechargeable battery, which is made up of individual battery cells. The capacitive component is in particular a capacitor or a capacitor circuit arrangement, and the inductive component is in particular a coil or a coil circuit arrangement. The inductive component has a known inductance L and the capacitive component has a known capacitance C.

In particular, it is provided that the characteristic status parameter is a state of charge (SOC) and/or an aging status and/or a state of health (SOH) of the memory unit. Preferably, the characteristic status parameter is the aging status of the memory unit, since this aging status exhibits the clearest dependency on the internal resistance of the electric memory unit.

In a preferred embodiment of the invention, it is provided that at least one further capacitive component of the circuit arrangement is connected in, and for determining the parameter from the changed time-dependent voltage change, the oscillator circuit is re-excited. By connecting in the further capacitive component, a changed natural frequency of the oscillator circuit results, and thus a changed "time-dependent" "carrier frequency" of the voltage change.

Preferably, the oscillator circuit, after the time-dependent voltage change is ascertained, is damped by connecting in at least one electrical resistor having a resistance value higher than the internal resistance of the memory unit. By means of this additional damping, the current in the oscillator circuit rapidly diminishes.

It is also advantageously provided that the excitation device has another inductive component, which by means of a short-circuit current builds up a magnetic field, and this field, after the shutoff of the short-circuit current, generates a current flow which temporarily subjects the capacitive component to charging. The magnetic field that diminishes after the shutoff of the short-circuit current induces a voltage which generates the current flow. That flow ensures a charge transfer to the capacitive component. To prevent an ensuing outflow of the charge, a diode is disposed between the other inductive component and the capacitive component.

The invention further relates to an electric circuit arrangement for determining a characteristic status parameter of an electric memory unit that is dependent on an internal resistance of that memory unit, an aforementioned method. It is provided that the circuit arrangement has a current path, which has an inductive component and a capacitive component connected in series and which is electrically connected by means of two connection lines to the memory unit for forming an oscillator circuit, and also has an excitation device, supplied electrically by the memory unit, which excitation device, for exciting the oscillator circuit, is interconnected with the capacitive component by means of a temporary subjection of that capacitive component to a charge. The electric memory unit is a unit of an electric memory, in particular of a rechargeable battery. The smallest memory unit is a single memory cell, and the largest memory unit is the electric memory itself. The inductive component has a known inductance, and the capacitive component has a known capacitance. The excitation device is preferably supplied by a partial voltage of the electric memory. For tapping this partial voltage, the memory unit has at least one intermediate tap, and the excitation device is supplied electrically via this intermediate tap and at least one further tap of the memory unit.

In a preferred embodiment of the invention, it is provided that the excitation device has a short-circuit current path with a switch, the short-circuit current path being connected parallel to the capacitive component via excitation lines, and the excitation device is connected to the memory unit via supply lines, and one of the excitation lines has a diode, and a supply line connected to this excitation line has a further inductive component. By closure of the switch disposed in the short-circuit current path, a short-circuit current results which builds up a magnetic field in the further inductive component. If the switch in the short-circuit current path is then opened, the short-circuit current is shut off, and the diminishing induces a voltage peak that is markedly higher than the voltage of the memory unit. This voltage peak generates a current through the excitation line having the diode, which current temporarily subjects the capacitive component of the circuit arrangement to a charge. An ensuing reverse flow of the charges in the direction of the further inductive component is prevented by means of the diode that blocks in that direction.

In a further advantageous feature of the invention, it is provided that the circuit arrangement has at least one further current path, which is connected parallel to the capacitive component and has a further capacitive component and a further switch connected in series. By means of this further current path, a further capacitive component that can be connected in is implemented. The resultant parallel circuit of the capacitive component and the connected-in capacitive component has a total capacitance which corresponds to the sum of the capacitances of the capacitive component and the further capacitive component. The result of this changed total capacitance is an oscillator circuit with a different natural frequency.

It is also provided advantageously that the circuit arrangement has at least one damping current path, which is connected parallel to the inductive component and has a resistor element, having a resistance value higher than the internal resistance, and a switch connected in series. The current through the oscillator circuit can be quickly reduced to zero by closure of the switch disposed in the damping current path.

Finally, it is advantageously provided that the circuit arrangement has a measuring instrument, which for ascertaining a time-dependent voltage change at the capacitive component is interconnected with that capacitive component. This measuring instrument is preferably connected to an evaluation device for determining the characteristic status parameter.

The invention further relates to an electric memory, in particular an electric memory of an electric drive and/or hybrid drive of a motor vehicle, having at least one electric memory unit and having at least one aforementioned circuit arrangement.

BRIEF DESCRIPTION OF THE DRAWINGS

The invention will be described in further detail below in conjunction with the associated drawings. In the drawings.

DESCRIPTION OF THE PREFERRED EMBODIMENT

Figure 1:
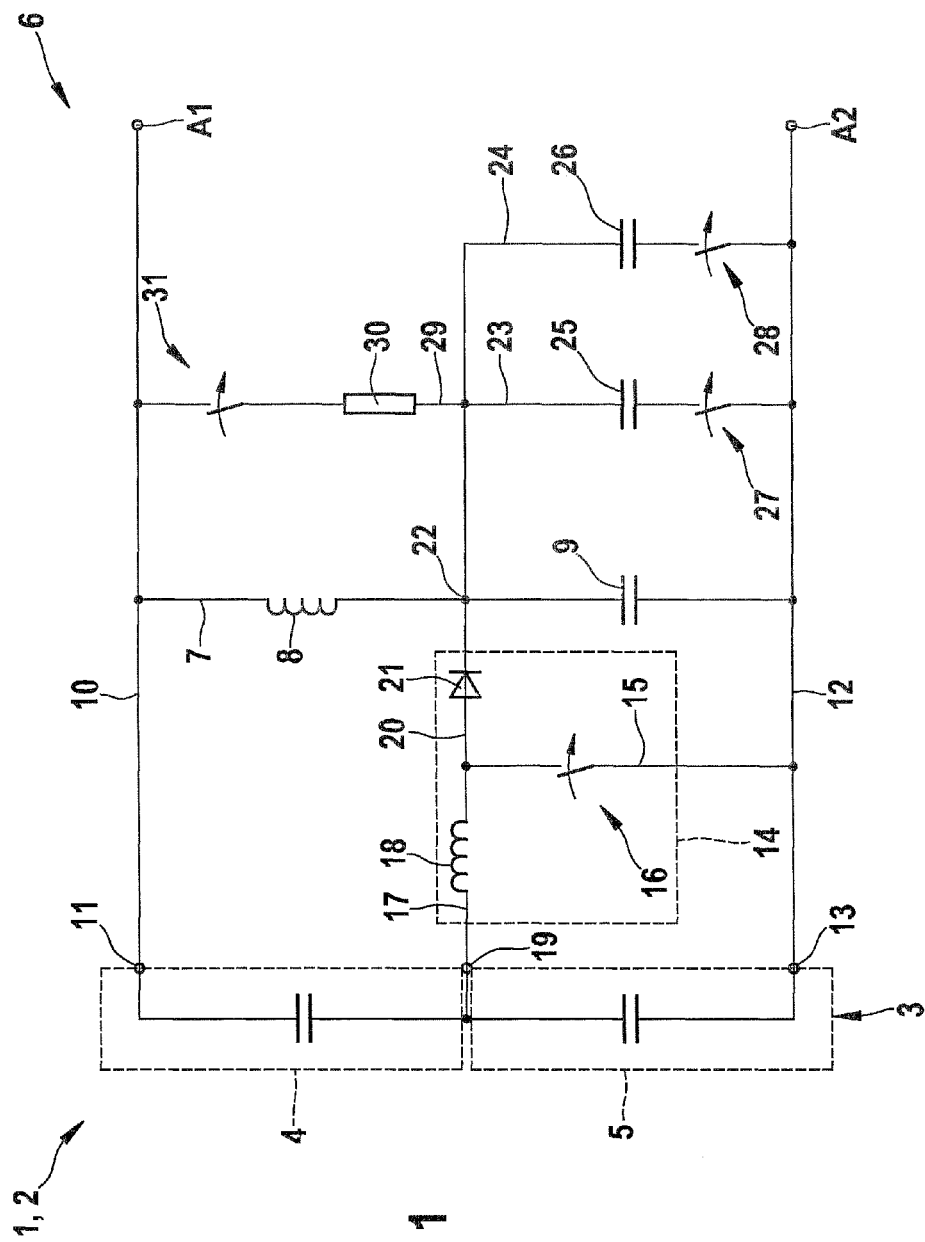
FIG. 1 shows an electric memory unit and an electric circuit arrangement having a current path, which has one inductive component and one capacitive component and is connected to the memory unit and with it forms an oscillator circuit.

FIG. 1 shows an electric memory 2, embodied as a rechargeable battery 1, for electrical supply to an electrical machine, not shown, of an electric drive of a motor vehicle. The electric memory 2 is formed by an electric memory unit 3 with electric memory cells 4, 5. The memory cells 4, 5 of the rechargeable battery 1 are two battery cells.

FIG. 1 also shows an electric circuit arrangement 6, which is disposed in the motor vehicle between the electric memory unit 3 and an on-board operating system, not shown, of the electric drive. The electric circuit arrangement 6 has a current path 7, in which an inductive component 8, embodied as a coil, and a capacitive component 9, embodied as a capacitor, are disposed in series. The current path 7 is connected to a positive contact element 11 of the electric memory unit 3 by means of a first connection line 10 and to a negative contact element 13 of the electric memory unit 3 via a second connection line 12. The connection lines 10, 12 also connect the memory unit 3 to an on-board operating system of the motor vehicle, not shown, which is connectable via terminals A1, A2.

The electric circuit arrangement 6 furthermore has an excitation device 14 for exciting an electric oscillator circuit, formed by the inductive component 8, the capacitive component 9, and an internal resistance of the electric memory unit 3, to vanishing. The excitation device 14 has a short-circuit current path 15, which is connected parallel to the capacitive component 9 of the second electric memory cell 5. The short-circuit current path 15 has a switch 16 and is connected on one side to negative contact elements 13 of the electric memory unit 3 and to the capacitive component 9, via the second connection line 12 embodied as a ground line. On the other, the short-circuit current path 15 is connected both to an intermediate tap 19 via a supply line 17, in which a further inductive component 18 is disposed, and to the current path 7 at a node point 22, via an excitation line 20, in which a diode 21 has that blocks a current in the direction of the short-circuit current path 15 and of the further inductive component 18. Parallel to the capacitive component 9, there are two further current paths 23, 24, which each have one further capacitive component 25, 26 and a respective series circuit with a further switch 27, 28 connected to the associated capacitive component 25, 26.

The circuit arrangement 6 furthermore has a damping current path 29, which is connected parallel to the inductive component 8 and has a resistor element 30, with a resistance value that is higher than the internal resistance R of the electric memory unit 3, and a switch 31 for connecting in the resistor element 30.

The result is the following function: The excitation of the oscillator circuit is effected via the further inductive component 18, the switch 16 in the short-circuit current path 15, and the diode 21. The further inductive component 18 is connected to a potential lower than the total voltage of the electric memory unit 3, which in FIG. 1 is for example half the total voltage of the electric memory unit 3.

At the beginning of the method for determining the characteristic status parameter, in this case the aging status, that is dependent on the internal resistance of the memory unit 3, the current I through the inductive component 8 is zero (I=0 A), and the voltage via the capacitive component 9 is equal to the total voltage of the electric memory unit 3. The switch 16 in the short-circuit current path is temporarily closed. In this operating mode, the current builds up a magnetic field by means of the further inductive component 18. If the switch 16 in the short-circuit current path 15 is re-opened, a current resulting from the inductance L2 of the further inductive component 18 flows through the diode 21 to the capacitive component 9 and charges it to a voltage higher than the total voltage of the electric memory unit 3. Energy is thus supplied to the oscillator circuit, formed of the inductive component 8, the capacitive component 9, and the internal resistance of the electric memory unit 3. The quantity of energy supplied is determined by a time interval during which the switch 16 in the short-circuit current path 15 is closed.

The foregoing relates to the preferred exemplary embodiment of the invention, it being understood that other variants and embodiments thereof are possible within the spirit and scope of the invention, the latter being defined by the appended claims.

Thus a current also now begins to flow through the inductive component 8 of the oscillator circuit, whose natural frequency is determined by the inductance L of the inductive component 8 and the capacitance C of the capacitive component 9. At the capacitive component 9, by means of a measuring instrument, not shown, a time-dependent voltage change is ascertained by measurement. From this, an evaluation device, also not shown, determines the characteristic status parameter of the aging status of the electric memory unit 3. The status parameter is a parameter that determines the internal resistance. The status parameter and the internal resistance of the memory unit are therefore parameters dependent on one another.

Figure 2:
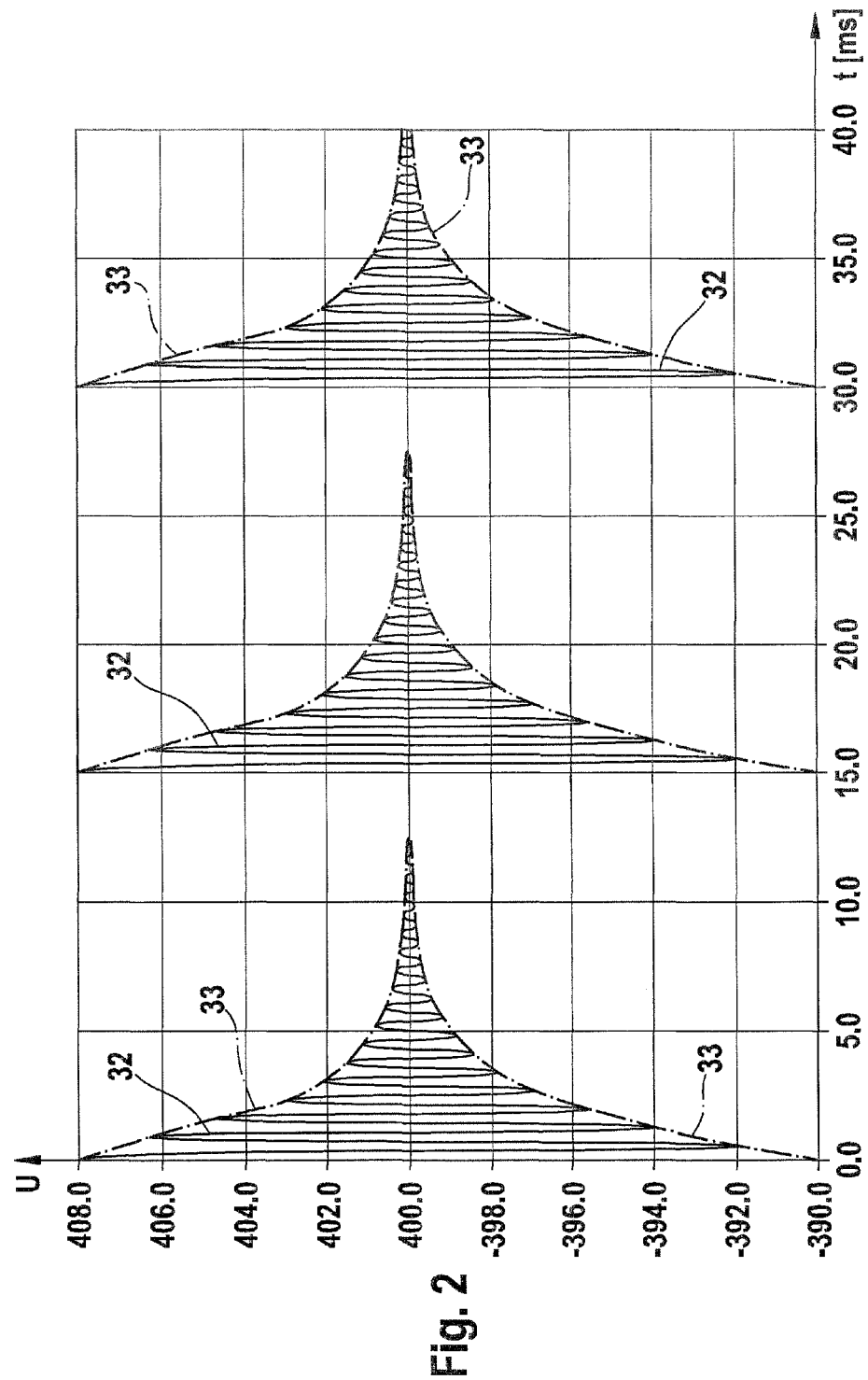
FIG. 2 is a graph in which the time-dependent voltage change at the capacitive component of FIG. 1 is plotted over time after a respective excitation.

FIG. 2 shows the voltage course 32 of the voltage at the capacitive component 9 as a function of the time t with the switch 31 of the damping current path 29 closed, in which course the oscillator circuit is excited every 15 seconds by closure and ensuing opening of the switch 16 in the short-circuit current path 15. The voltage course 32 after each excitation is determined by a periodic oscillation having the natural frequency of the oscillator circuit as the carrier frequency and by an exponentially dropping "envelope" 33. The natural frequency of the oscillator circuit is determined by the inductance L of the inductive component and the capacitance C of the capacitive component, while the damping that determines the envelope is determined by the ohmic resistance and the capacitance C of the oscillator circuit. If the resistor element 30 of the damping path 29 is not connected in, then this ohmic resistance value is determined by the internal resistance R of the memory unit 3.

The invention claimed is:

1. A method for determining a characteristic status parameter of a storage unit by means of an electric circuit arrangement in which at least one inductive component and at least one capacitive component, which with the storage unit form an oscillator circuit, are disposed having the following steps:
   supplying a voltage produced by the storage unit to an excitation device, the excitation device being connected between the storage unit and the oscillator circuit;
   activating the excitation circuit to excite the oscillator circuit temporarily;
   generating a current flow from the excitation device to the oscillator circuit using the voltage in response to activating the excitation circuit, the current flow temporarily subjecting the capacitive component to a charge;
   ascertaining a time-dependent voltage change at the capacitive component after termination of the excitation; and
   determining the characteristic status parameter from a time dependency of the voltage change.

2. The method as defined by claim 1, wherein the characteristic status parameter is one of a state of charge, an aging status, or a state of health of the storage unit.

3. The method as defined by claim 1, wherein a first inductive component and a first capacitive component of the electric circuit arrangement are connected in series between a positive and a negative contact of the storage unit to form a first current path,
   wherein at least one further capacitive component of the circuit arrangement is connected in parallel to the first capacitive component.

4. The method as defined by claim 3, wherein the excitation circuit is connected to a node between the first capacitive component and the first inductive component, and
   wherein the at least one further capacitive component of the circuit arrangement is connected to the node in parallel to the first capacitive component.

5. The method as defined by claim 4, wherein at least one electrical resistor is connected to the node in parallel to the first inductive component, the at least one electrical resistor having a resistance value higher than an internal resistance of the storage unit for damping the oscillator circuit.

6. The method as defined by claim 1, wherein the excitation device has a further inductive component for generating the current flow, the further inductive component being provided in an excitation line that connects a voltage tap of the storage unit to the node,
   wherein the excitation device includes a short-circuit path that connects the excitation line to ground and includes a switch for opening and closing the short-circuit path,
   wherein the switch is closed to activate the excitation device to excite the oscillator circuit,
   wherein a short-circuit current builds up a magnetic field in the further inductive component while the switch is closed, and
   wherein, when the switch is opened, the short-circuit current is shutoff and the magnetic field generates the current flow which temporarily subjects the capacitive component to a charge.

7. The method as defined by claim 5, wherein the excitation device has a further inductive component for generating the current flow, the further inductive component being provided in an excitation line that connects a voltage tap of the storage unit to the node,
   wherein the excitation device includes a short-circuit path that connects the excitation line to ground and includes a switch for opening and closing the short-circuit path,
   wherein the switch is closed to activate the excitation device to excite the oscillator circuit,
   wherein a short-circuit current builds up a magnetic field in the further inductive component while the switch is closed, and
   wherein, when the switch is opened, the short-circuit current is shutoff and the magnetic field generates the current flow which temporarily subjects the capacitive component to a charge.

* * * * *